United States Patent
Kim et al.

(10) Patent No.: US 8,369,106 B2
(45) Date of Patent: Feb. 5, 2013

(54) PLASMA DISPLAY APPARATUS TO REDUCE EMI EMISSION

(75) Inventors: Hong-jin Kim, Suwon-si (KR);
Young-ki Shon, Hwaseong-si (KR);
Jae-wook Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 220 days.

(21) Appl. No.: 12/839,681

(22) Filed: Jul. 20, 2010

(65) Prior Publication Data
US 2011/0032691 A1 Feb. 10, 2011

(30) Foreign Application Priority Data
Aug. 10, 2009 (KR) .................. 10-2009-0073123

(51) Int. Cl.
*H05K 9/00* (2006.01)
(52) U.S. Cl. ............... 361/818; 361/799; 361/807
(58) Field of Classification Search .......... 361/800, 361/816, 818, 807, 810, 683, 679.01, 799, 361/809; 174/51, 35 R, 350
See application file for complete search history.

(56) References Cited

U.S. PATENT DOCUMENTS

| | | | | |
|---|---|---|---|---|
| 6,882,108 | B2* | 4/2005 | Kim et al. .................. | 313/582 |
| 7,224,121 | B2* | 5/2007 | Ahn ......................... | 313/582 |
| 7,457,120 | B2* | 11/2008 | Bae et al. .................. | 361/704 |
| 2009/0115919 | A1* | 5/2009 | Tanaka et al. .............. | 348/836 |
| 2009/0237907 | A1 | 9/2009 | Kunimoto et al. | |
| 2009/0251390 | A1 | 10/2009 | Kumoi et al. | |
| 2011/0001734 | A1* | 1/2011 | Kim ......................... | 345/204 |
| 2012/0063069 | A1* | 3/2012 | Han ......................... | 361/679.01 |

OTHER PUBLICATIONS

Communication dated Oct. 4, 2011, issued by the European Patent Office in corresponding European Patent Application. No. 10171699.1.

* cited by examiner

*Primary Examiner* — Hung S Bui
(74) *Attorney, Agent, or Firm* — Sughrue Mion, PLLC

(57) ABSTRACT

A plasma display apparatus having a structure of a base chassis to reduce EMI emission is provided. The plasma display apparatus includes a panel, a driving circuit, and a base chassis having at least one slit formed thereon.

12 Claims, 17 Drawing Sheets

US 8,369,106 B2

PLASMA DISPLAY APPARATUS TO REDUCE EMI EMISSION

CROSS-REFERENCE TO RELATED PATENT APPLICATIONS

This application claims priority from Korean Patent Application No. 10-2009-73123, filed on Aug. 10, 2009 in the Korean Intellectual Property Office, the disclosure of which is incorporated herein by reference in its entirety.

BACKGROUND

1. Field of the Invention

Methods and apparatuses consistent with exemplary embodiments relate to reducing electromagnetic interference (EMI) emission of a plasma display apparatus, and more particularly, to reducing EMI emission of a plasma display apparatus by a structure of a base chassis.

2. Description of the Related Art

A flat type display apparatus has been widely used mainly in a portable device, and is increasingly substituted for a cathode ray tube (CRT) display in the field of a large display apparatus thanks to the development of technology.

Among such flat type display apparatuses, a plasma display panel (PDP) displays text and/or graphics using light emitted from plasma which is generated during gas discharge. Compared to the other types of flat type display apparatuses, the PDP has benefits of high brightness and high light emitting efficiency and a wide viewing angle, so it is widely used in recent years.

However, one disadvantage of the PDP is that electromagnetic wave noise occurs when a plasma display apparatus is driven, and causes EMI. That is, since a high level of voltage of about 200V and root mean square (RMS) current of 2 A or more are applied to electrodes of the PDP, energy of driving wave causing gas discharge causes the electrodes of the panel to emit the EMI through an antenna.

The EMI creates electromagnetic wave noise interference which hinders reception of a desirable electromagnetic signal and thus may cause malfunction of an electronic device. Also, the EMI is absorbed into a living body in the form of electronic energy and increases the temperature of the living body, thereby damaging tissue/function of the living body.

Accordingly, there is a need for a method for reducing the EMI generated during the driving of the PDP.

SUMMARY

Exemplary embodiments may overcome the above disadvantages and other disadvantages not described above. Also, exemplary embodiments are not required to overcome the disadvantages described above, and one or more exemplary embodiments may not overcome any of the problems described above.

Exemplary embodiments provide a plasma display apparatus which has a structure of a base chassis to reduce EMI emission.

According to an aspect of an exemplary embodiment, there is provided a plasma display apparatus including: a panel, a driving circuit which drives the panel, and a base chassis having a first area which is connected to the driving circuit and having at least one slit formed around the first area.

The base chassis may further have a second area which is different from the first area. The at least one slit may divide the base chassis into the first area and the second area.

The at least one slit may be two or more slits such that an electric passage is formed in the base chassis between the two or more slits between the first area and the second area.

The first area and the driving circuit may be electrically connected so that current generated by the driving circuit may be transmitted to the first area.

Two or more slits may be provided, and part of the current transmitted to the first area may be transmitted from the first area to the second area through a passage formed between the two or more slits, and remaining current transmitted to the first area may be circled in the first area, thereby offsetting EMI.

A degree of the offset EMI may be determined based on a width of each slit and a gap between the slits.

The driving circuit may include an X electrode driving circuit and a Y electrode driving circuit, and the at least one slit may include at least one first slit which is formed around the first area to which the X electrode driving circuit is connected, and at least one second slit which is formed around the second area to which the Y electrode driving circuit is connected.

A plurality of the first slits or a plurality of the second slits may be provided, and an electric passage may be formed in the base chassis between the plurality of the first slits or between the plurality of the second slits.

The plasma display apparatus may further include: a controller which controls the driving circuit, and an isolation IC which electrically isolates ground levels between the controller and the driving circuit.

The driving circuit and the base chassis may be connected to each other through a conductive material.

According to an aspect of another exemplary embodiment, there is provided a plasma display apparatus including: a panel, a driving circuit which drives the panel, and a base chassis having a first area to which the driving circuit is connected, and a second area which is different from the first area, and a predetermined connecting area which connects the first area and the second area and forms a single-point ground.

BRIEF DESCRIPTION OF THE DRAWINGS

The above and/or other exemplary aspects will be more apparent by describing in detail exemplary embodiments, with reference to the accompanying drawings in which.

DETAILED DESCRIPTION OF EXEMPLARY EMBODIMENTS

Figure 1:
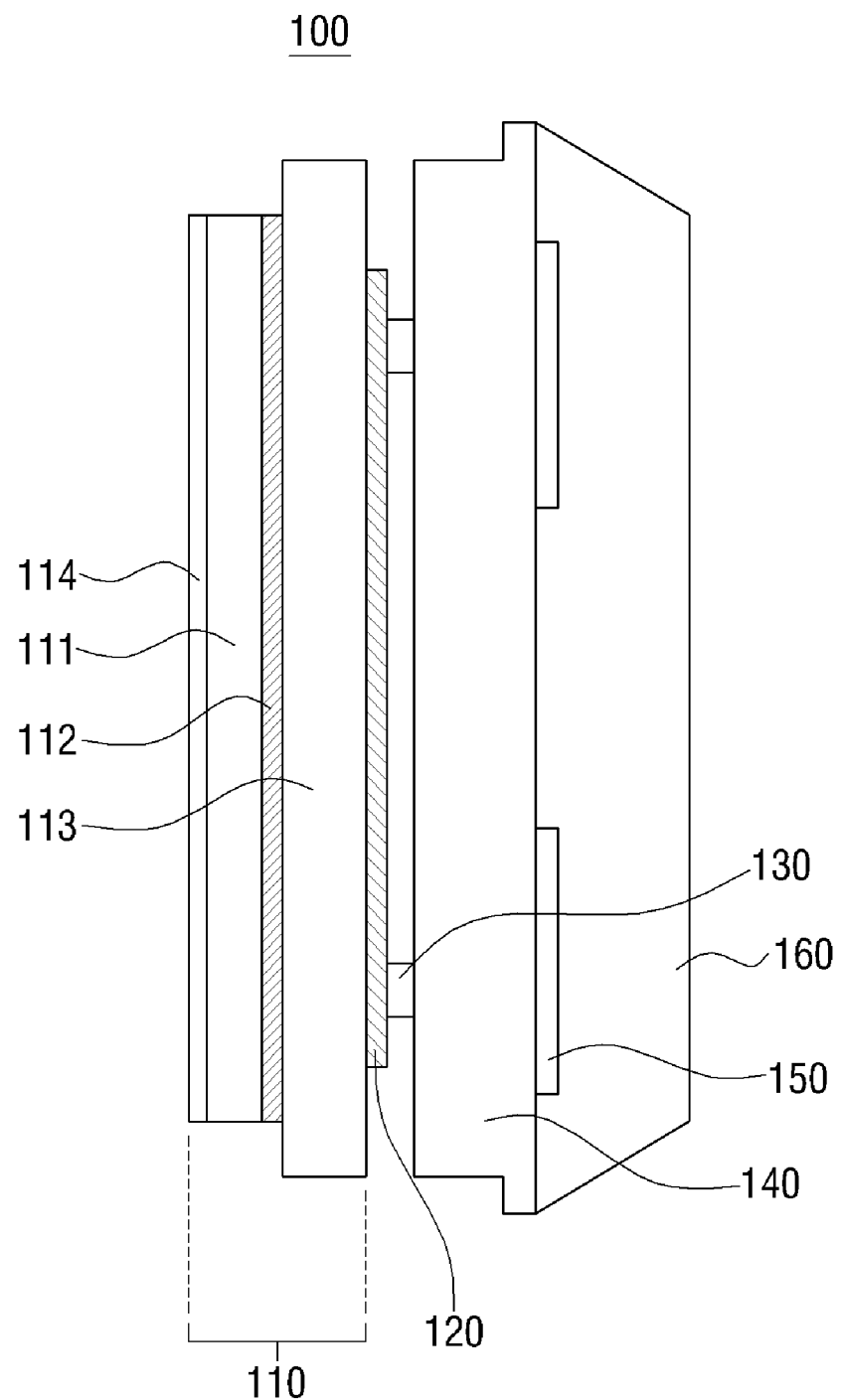
FIG. 1 is a side cross section view illustrating a plasma display apparatus according to an exemplary embodiment.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of the invention. Thus, it is apparent that the exemplary embodiments can be carried out without those specifically defined matters. Also, functions or elements known in the related art are not described in detail since they would obscure the description with unnecessary detail.

FIG. 1 is a side section view illustrating a plasma display apparatus 100 according to an exemplary embodiment. The plasma display apparatus 100 satisfies an appropriate electromagnetic wave standard for EMI and provides an image which can be viewed by a user.

The plasma display apparatus 100 includes a panel 110, a thermal spread sheet (TSS) 120, a gasket 130, a base chassis 140, a driving circuit 150, and a back cover 160.

The panel 110 excites a fluorescent material with vacuum ultraviolet rays caused by inner gas discharge, thereby realizing an image. The panel 110 includes an upper panel 111 and a lower panel 113. The upper panel 111 and the lower panel 113 are bonded at their edges with a sealing material 112 to form the single panel 110. In an inner space between the upper panel 111 and the lower panel 113 the edges of which are sealed with the sealing material 112, a plurality of discharge cells is arranged and each discharge cell is filled with a mixture of Ne and Xe.

A functional material 114 is coated on the upper portion of the upper panel 111 to provide surface reflection prevention, color correction, and near infrared ray absorption. The functional material 114 may be directly coated on the upper portion of the upper panel 111. This will be explained with reference to FIGS. 2 to 7.

Figure 2:
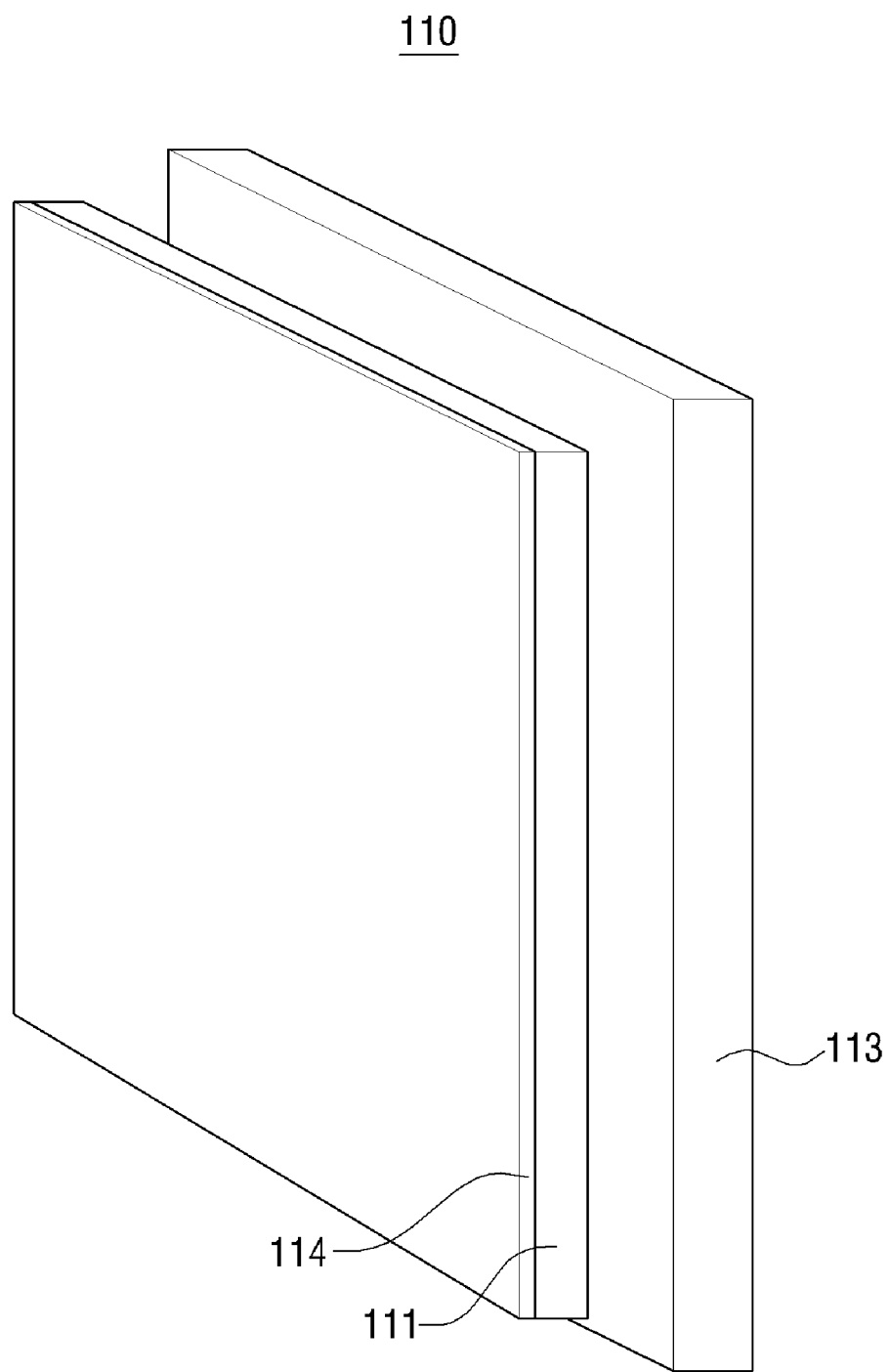
FIG. 2 is a view illustrating an upper plate glass coated with a functional material.

FIG. 2 is a view illustrating the upper panel 111 coated with a functional material. In FIG. 2, the lower panel 113 is illustrated along with the upper panel 111 and the functional material 114 for the convenience of explanation, but the sealing material 112 is not illustrated.

As shown in FIG. 2, the functional material 114 is coated on the upper side of the upper panel 111, which opposes the lower panel 113, that is, on the side to be viewed by a user. The functional material 114 is divided into a first material to prevent surface reflection, a second material to correct color and improve color purity, and a third material to absorb near infrared rays.

As the first material to prevent surface reflection, $SiO_2$, $ZrO$, and/or $TiO_2$ having an optical reflection preventing characteristic may be used. By coating the upper panel 111 with such a material, effulgence of a viewer and scratch and static electricity on the surface are prevented.

As the second material to correct color and improve color purity, a pigment absorbing light having a wavelength of 580 nm to 590 nm may be used. By coating the upper panel 111 with such a material, the light having a wavelength of 580 nm to 590 nm is prevented from being output to the user and thus color reproducibility and correct white deviation are improved.

As the third material to absorb near infrared rays, silver (Ag) inducing optical interference of a multi-layer film or a pigment absorbing light having a wavelength of a near infrared ray bandwidth (from 800 nm to 1200 nm) may be used. By coating the upper panel 111 with such a material, the light having a wavelength of 800 nm to 1200 nm can be prevented from being output to the user and thus malfunction of the plasma display apparatus 100 caused by the interference with a remote controller's wavelength bandwidth is prevented.

The second material to correct color and improve color purity is coated on the upper panel 111 because the discharge cells are filled with Ne as described above. Also, the third material to absorb near infrared rays is coated on the upper panel 111 because the discharge cells are filled with Xe as described above. That is, Ne generates the light having a wavelength of 580 nm to 590 nm during the discharging operation, and Xe generates a wavelength of the near infrared rays bandwidth, but the wavelengths generated by Ne and Xe deteriorate color quality of the plasma display apparatus 100 and may cause malfunction with the interference with a remote controller.

Figure 3:
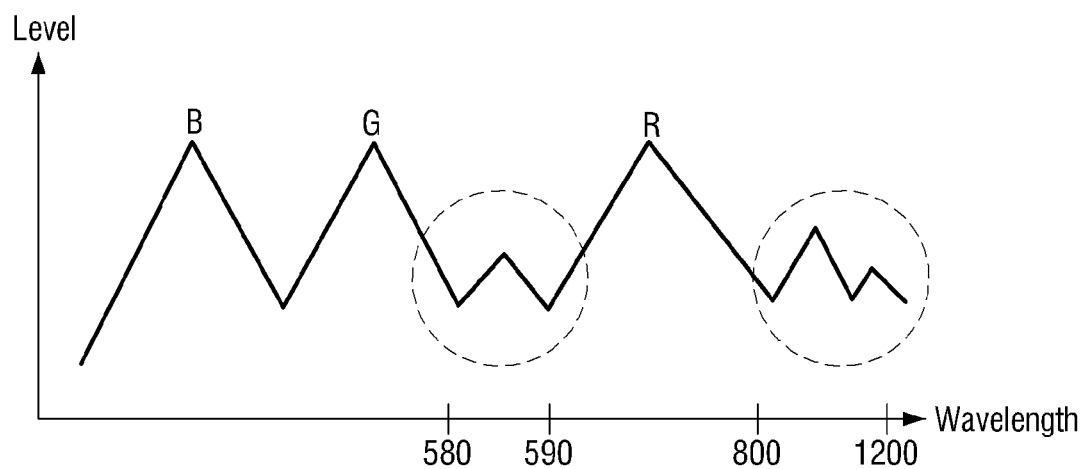
FIG. 3 is a view provided to explain the role of a functional material with reference to a wavelength.
Figure 3:
Figure 3:
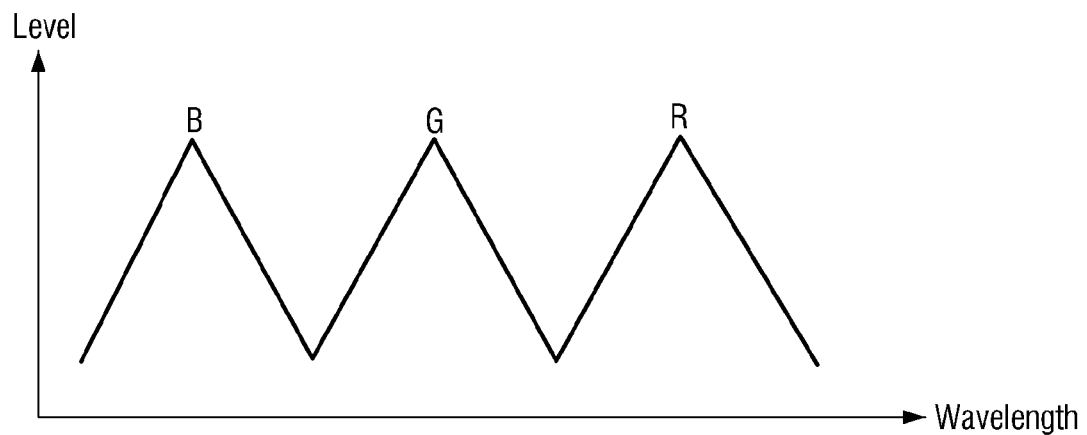

By coating the functional material capable of solving the above problems on the upper portion of the upper panel 111, the plasma display apparatus 100 filters out the light having the wavelength of 580 nm to 590 nm and the light having the wavelength of 800 nm to 1200 nm. FIG. 3 is a view provided to explain the role of the functional material with reference to the wavelength.

Accordingly, the user can view an image of high quality without malfunction.

The plasma display apparatus 100 according to an exemplary embodiment does not require an extra configuration or material to shield the EMI on the upper portion of the upper panel 111, that is, on the front surface of the plasma display apparatus 100. This is because use of the gasket 130 and a structure of the base chassis 140 can shield the EMI and detailed description thereof will be provided below.

Hereinafter, a process of coating the functional material 114 on the upper panel 111 will be described with reference to FIGS. 4 to 7.

Figure 4:
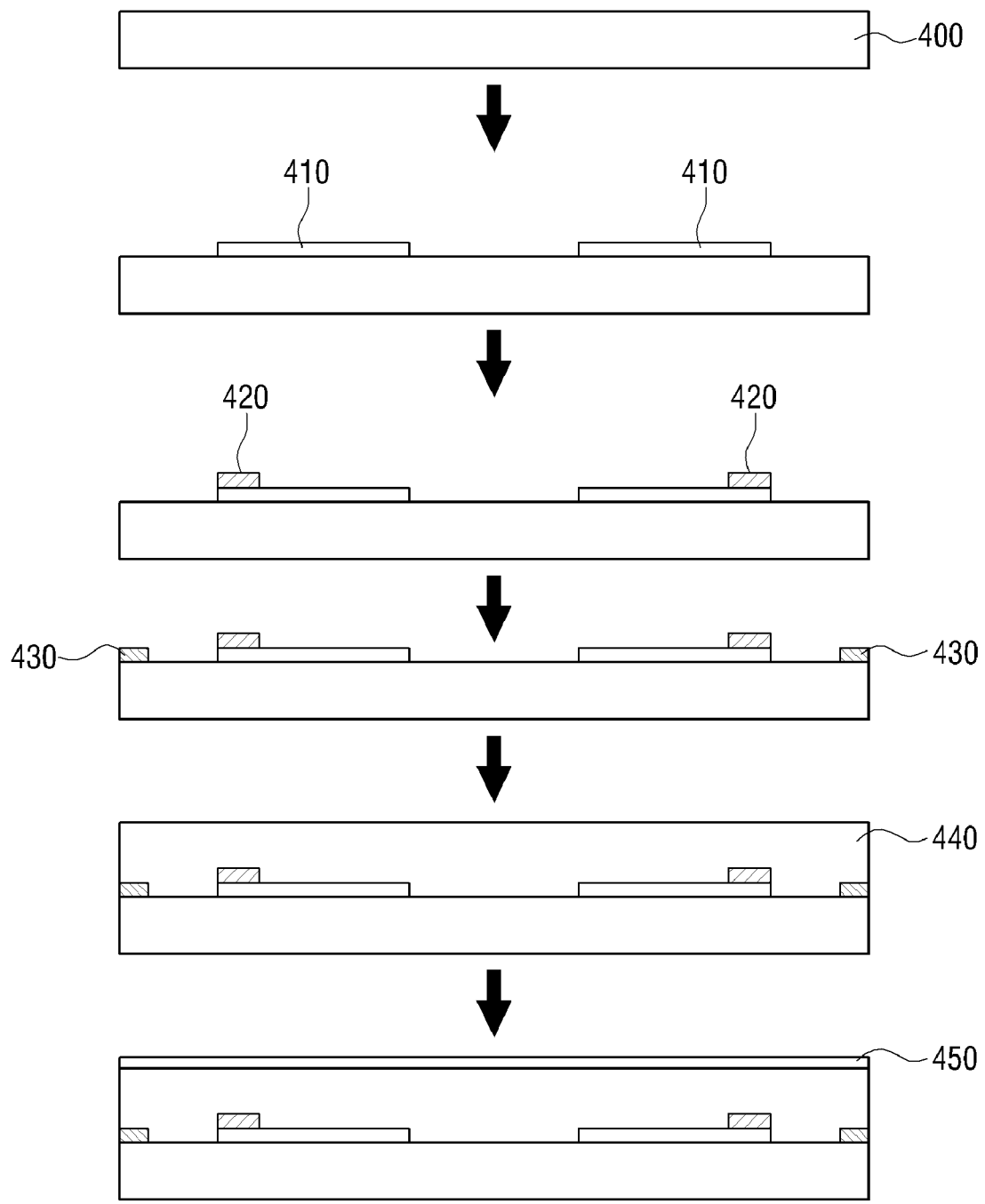
FIG. 4 is a view illustrating a process of producing an upper panel.

FIG. 4 is a view illustrating a process of producing the upper panel 111. In order to produce the upper panel 111, an upper glass 400 is provided and indium tin oxide (ITO) electrodes 410 are patterned on the upper portion of the upper glass 400. The ITO electrodes 410 are transparent electrodes, which are used to prevent light generated between an X electrode and a Y electrode, which will be described below, from becoming invisible due to the opaque X and Y electrodes.

After patterning the ITO electrodes 410, bus electrodes (X electrode and Y electrode) 420 are patterned on the upper portions of the ITO electrodes 410. The X electrode and the Y electrode receive a sustain voltage alternately and perform sustain discharging with respect to a selected pixel.

After patterning the bus electrodes 420, black stripes 430 are patterned on the upper portion of the upper glass 400. The black stripes 430 are formed between pixels and are used to maintain the pixels being spaced from one another.

After patterning the black stripes 430, a dielectric layer 440 and a MgO protective layer 450 are coated. The dielectric layer 440 and the MgO protective layer 450 maintain electric insulation between an address electrode, which will be described later, and the above-described bus electrodes 420 to stably generate plasma and prevent electrodes from being eroded by plasma.

The upper panel 111 is produced in the process described above.

Figure 5:
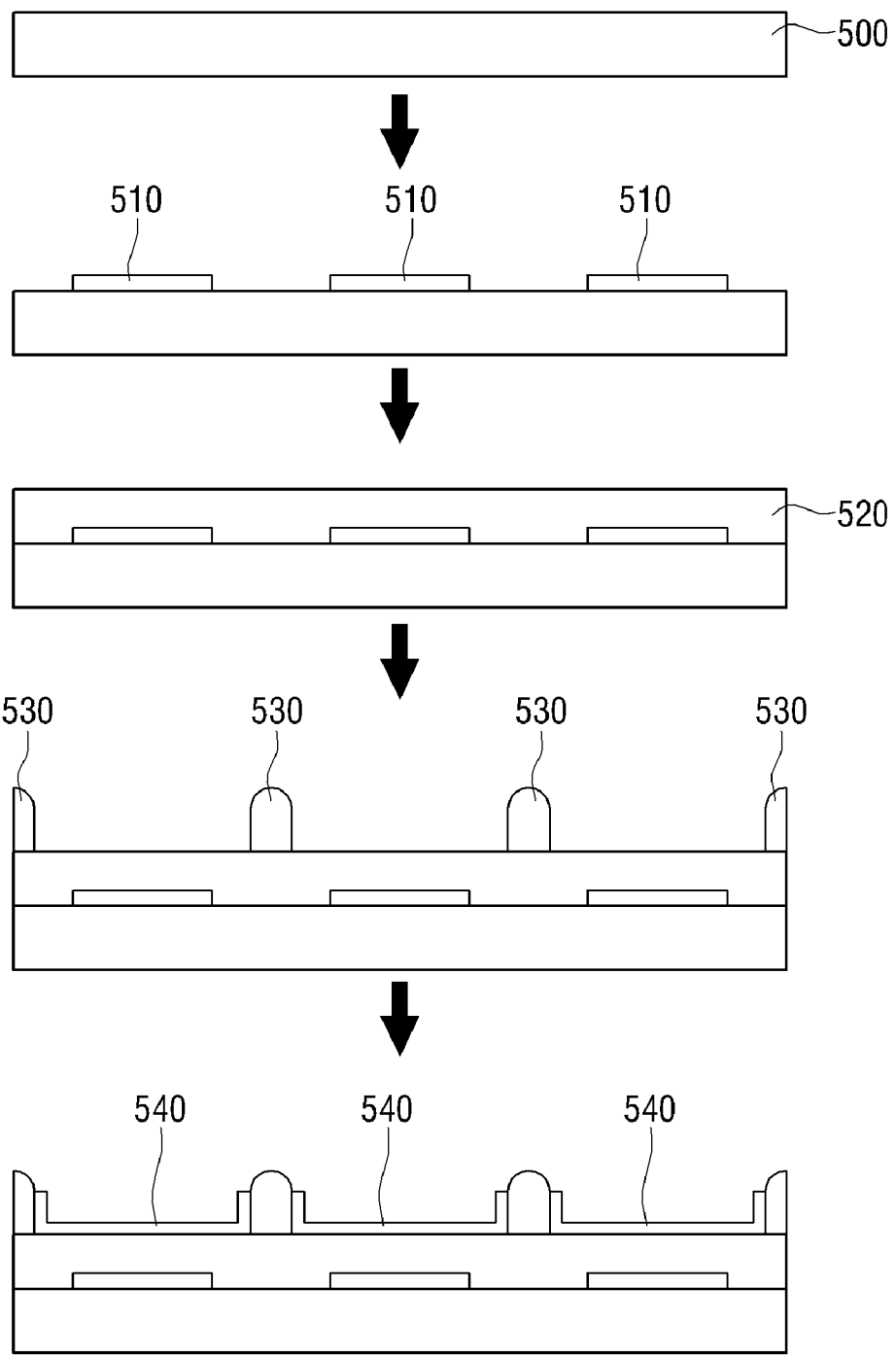
FIG. 5 is a view illustrating a process of producing a lower panel.

FIG. 5 is a view illustrating a process of producing the lower panel 113. In order to produce the lower panel 113, a lower glass 500 is provided and address electrodes 510 are patterned on the upper portion of the lower glass 500. The address electrodes 510 are used to transmit a data signal to select a pixel to be displayed.

After patterning the address electrodes 510, a dielectric layer 520 is coated. The dielectric layer 520 is used to stably generate plasma by maintaining electric insulation between the address electrodes 510 and the bus electrodes 420 and to prevent electrodes from being eroded by plasma, as described above.

Partitions 530 are formed on the upper portion of the dielectric layer 520. The partitions 530 serve to block fluorescent materials, which will be described later, from one another, thereby discriminating an R pixel, a G pixel, and a B pixel.

After forming the partitions 530, the fluorescent materials 540 are coated between the partitions 530.

The lower panel 113 is produced in the process described above.

If the upper panel 111 and the lower panel 113 are completely produced, the panel 110 is completed through processes such as assembling, sealing, gas injecting, aging, and lighting test of the upper panel 110 and the lower panel 113, and a process of coating the functional material 114 on the upper portion of the upper panel 111 of the panel 110 begins. Hereinafter, the process of coating the functional material 114 will be described with reference to FIG. 6.

Figure 6:
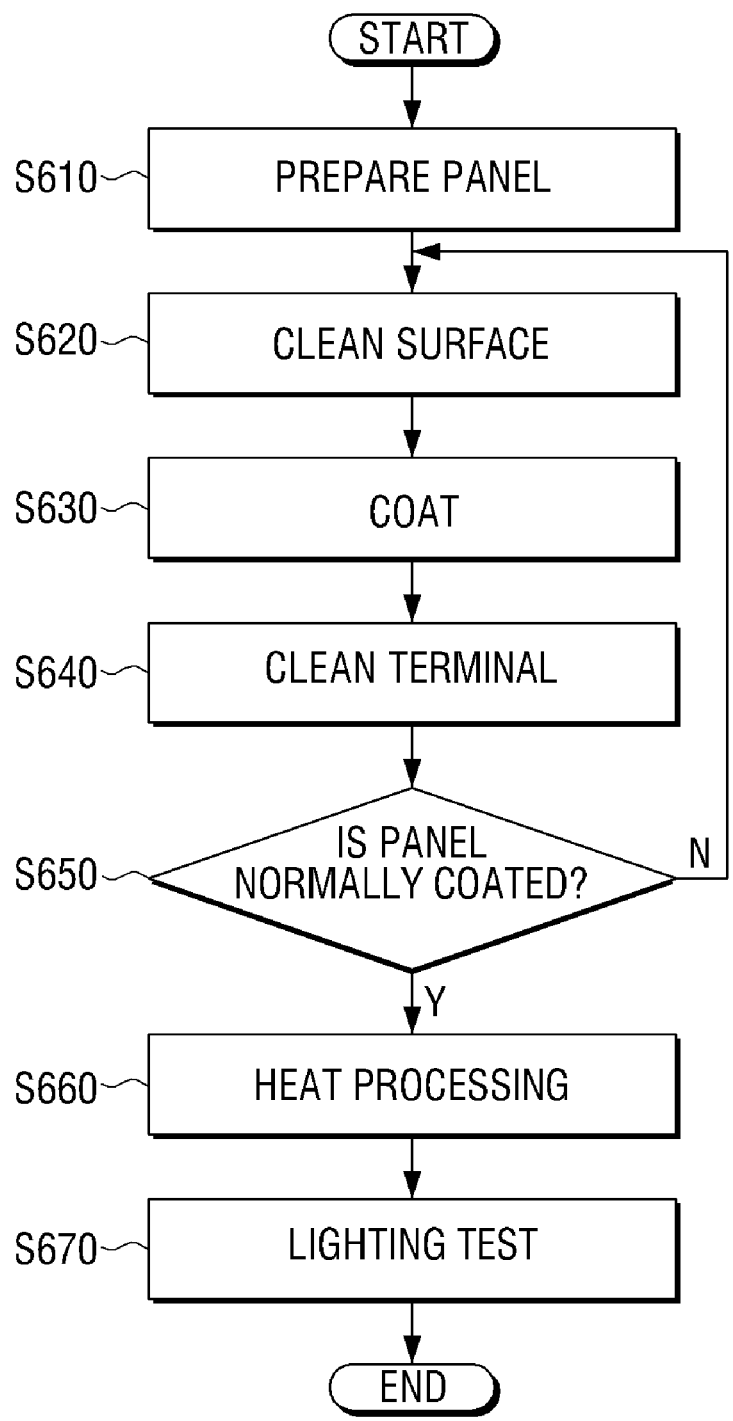
FIG. 6 is a flowchart illustrating a process of coating a functional material.

FIG. 6 is a flowchart illustrating a process of coating the functional material 114.

In order to coat the functional material 114, the panel 110 is prepared (S610) and the upper panel 111 of the panel 110 undergoes surface cleaning (S620).

If the surface cleaning is completed (S620), the functional material 114 is coated on the cleaned surface of the upper panel 111 (S630). More specifically, the functional material 114 is directly coated on the upper glass 400 constituting the upper panel 400.

After that, a terminal on which the bus electrodes 420 and the address electrodes 510 are patterned is cleaned (S640).

If the terminal cleaning is completed (S640), it is determined whether the functional material 114 is coated properly or not (S650). If there is no abnormality in coating the functional material 114 (S650-Y), heat processing (S660) and a lighting test (S670) are performed so that the coating of the functional material 114 is completed.

Figure 7:
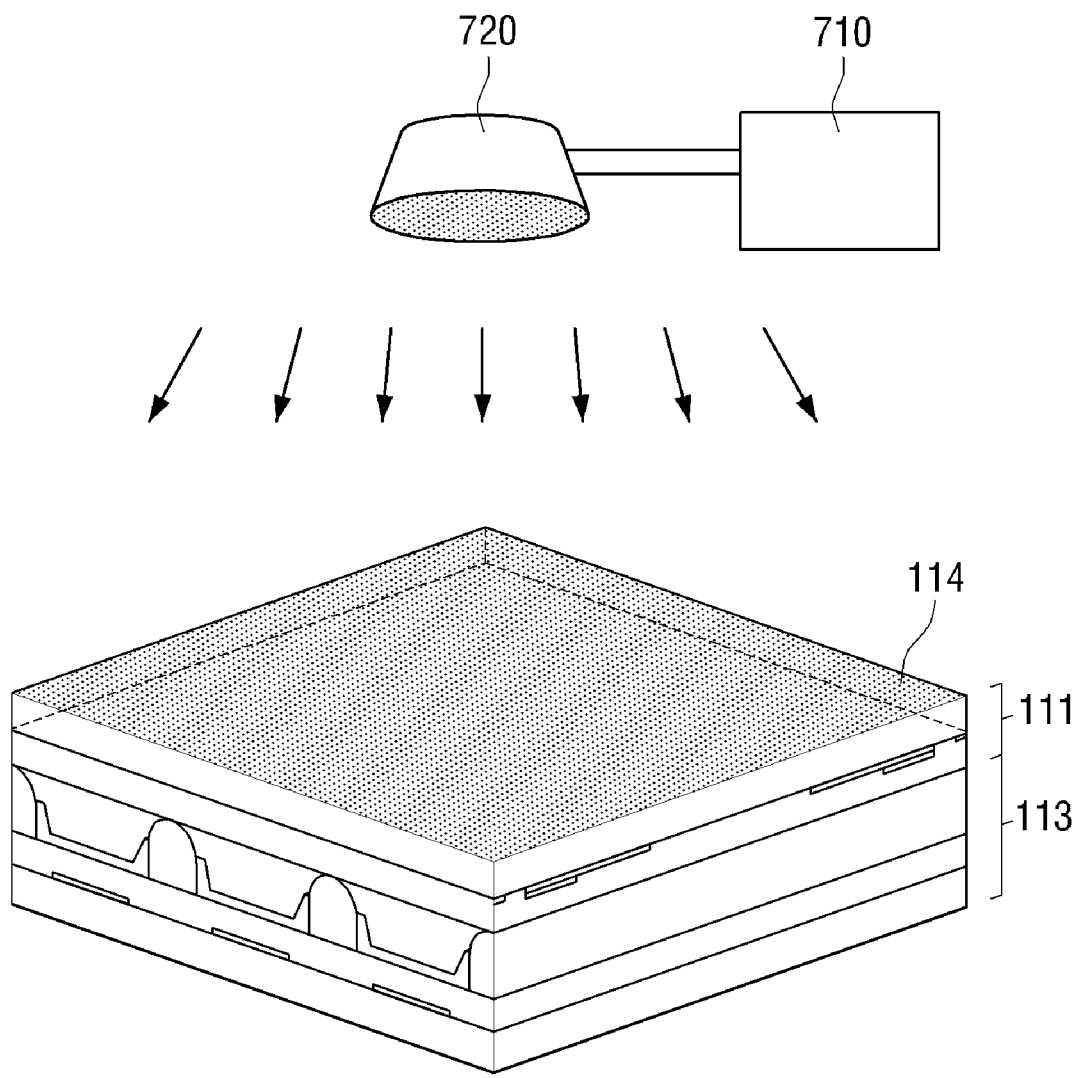
FIG. 7 is a view illustrating a panel coated with a functional material.

FIG. 7 is a view illustrating the panel 110 coated with the functional material 114. The above-described functional materials 114 (the first material for surface reflection prevention, the second material for color correction and color purity improvement, and the third material for near infrared rays absorption) are mixed and stored in a storage tank 710 as one material. The functional material 114 is coated on the upper panel 111 in a manner that the material 114 is sprayed through a spraying hole 720.

By coating the functional material 114 in a spraying manner, it is possible to solve a problem that air bubbles are generated by attaching a functional film and a problem that a process becomes complicated since films corresponding to each function should be separately coated/dried/cut.

Also, it is possible to prevent the generation of the EMI on the front surface of the plasma display apparatus 100, without adding an extra configuration or material to the panel 110 to shield the EMI. Shielding the EMI on the front surface can be achieved by using the gasket 130 and the structure of the base chassis 140.

Also, by storing the first material to prevent surface reflection, the second material to correct color and improve color purity, and the third material to absorb near infrared rays in one storage tank 710 and coating them one time, instead of separately coating the materials, the interface on the upper panel 111 can be reduced and, as the number of interfaces is reduced, a loss in light permeability is reduced so that the efficiency of the plasma display apparatus 100 can be improved.

Of course, each functional material may be separately stored in a different storage tank and coated on the panel 110 rather than being mixed and stored in the single storage tank 710 as one material.

Referring back to FIG. 1, to the rear surface of the panel 110, the front surface of which is coated with the functional material 114 described above, the TSS 120 is attached.

The TSS 120 is used to prevent deterioration of image quality which is caused by heat generated in the plasma display apparatus 100 and transmitted to only a part of a screen. That is, by attaching the TSS 120, the heat generated in the plasma display apparatus 100 becomes stabilized and is uniformly transmitted to the entire screen.

Also, the TSS 120 is coupled to the base chassis 140 through the gasket 130 to be used to shield the EMI. This will be described in detail with reference to FIGS. 8 and 9.

Figure 8:
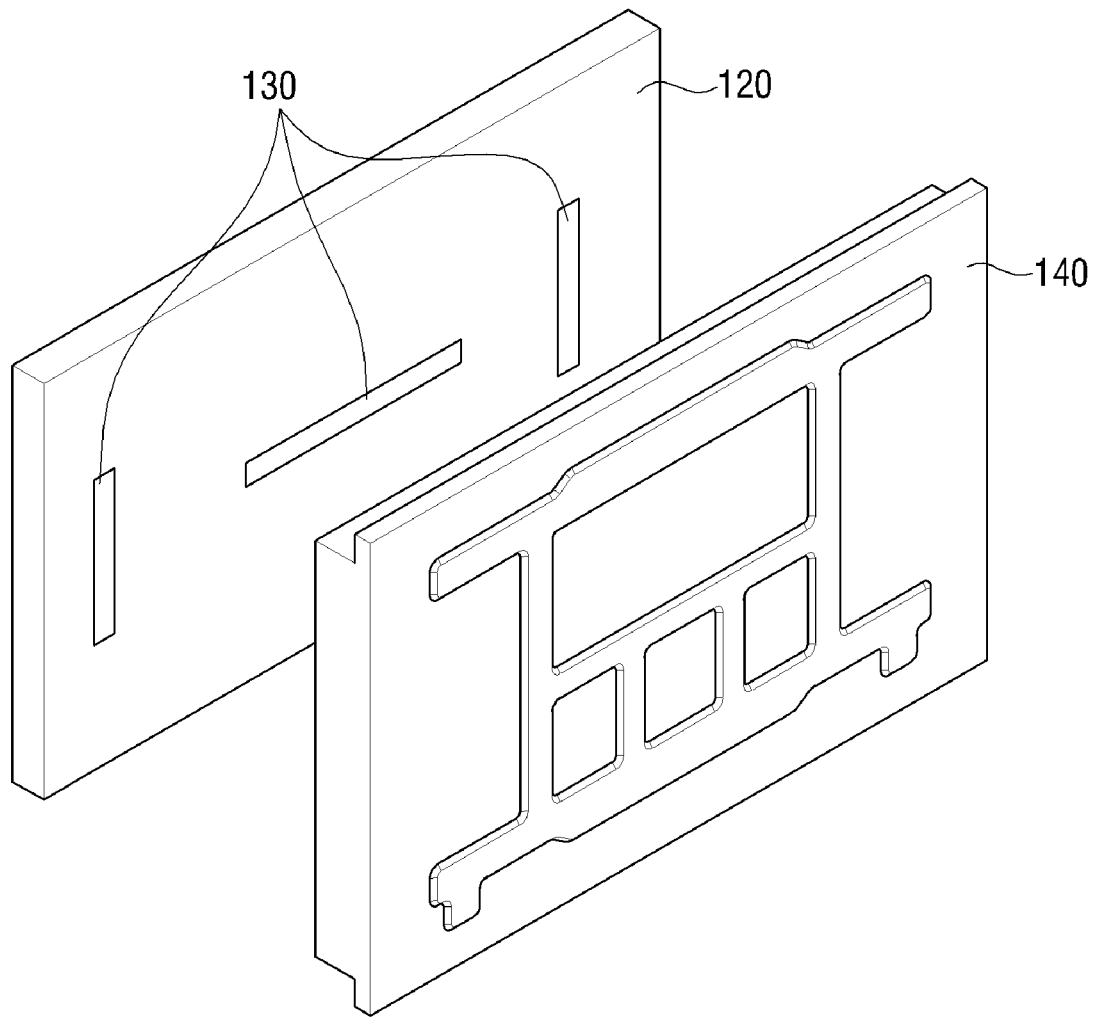
FIG. 8 is a view illustrating a coupling structure between a TSS and a base chassis.

FIG. 8 is a view provided to explain a coupling structure between the TSS 120 and the base chassis 140. As shown in FIG. 8, the TSS 120 and the base chassis 140 are not directly connected to each other and but instead are indirectly coupled to each other through the gasket 130.

The gasket 130 is made of a material having an adhesive property to couple the TSS 120 and the base chassis 140. Also, the gasket 130 may be made of a conductive material such as metallic fabric to transmit current generated in the base chassis 140 to the TSS 120 through the gasket 130.

The TSS 120 and the base chassis 140 are not directly connected or attached to each other because they are coupled to each other through the gasket 130. Accordingly, the EMI generated on the front surface of the plasma display apparatus 100 is reduced or shielded more effectively. This will be described with reference to FIG. 9.

Figure 9:
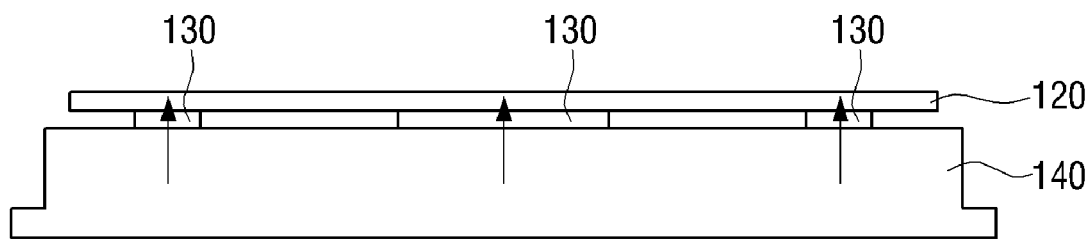
FIG. 9 is a view provided to explain a method for shielding EMI using a gasket.

FIG. 9 is a view provided to explain a method for shielding the EMI using the gasket 130. The TSS 120 and the base chassis 140 are indirectly coupled to each other through the gasket 130. That is, the base chassis 140 is grounded to the TSS 120 through the gasket 130.

As the gasket 130 is attached to only a portion of a surface of the base chassis 140 rather than the entire surface, a current flow from the base chassis 140 is divided into a first flow directed to the TSS 120, which is a ground, through the portion of the surface to which the gasket 130 is attached, and a second flow circling in the base chassis 140.

The first flow flowing into the TSS 120 through the surface to which the gasket 130 is attached is grounded at the TSS 120, and the second flow circling in the base chassis 140 offsets the EMI.

By coupling the TSS 120 and the base chassis 140 through the gasket 130, rather than directly connecting them, the EMI emitted in the base chassis 140 can be offset so that EMI emission noise can be further reduced than the situation in which the TSS 120 and the base chassis 140 are directly connected to each other.

In the above explanation, the current generated in the base chassis 140 is transmitted to the TSS 120. However, the base chassis 140 does not generate current by itself and the current is generated by a driving circuit attached to the rear surface of the base chassis 140 and is transmitted to the base chassis 140. That is, the base chassis 140 may be regarded as a ground to ground the current generated by the driving circuit, and the TSS 120 coupled to the base chassis 140 through the gasket 130 may be regarded as a ground to ground the current generated by the driving circuit.

Additionally, the plasma display apparatus 100 according to an exemplary embodiment uses double grounds to achieve the effect of removing the EMI emission noise, and the double grounds are coupled to each other at portions of the surfaces rather than at the whole surfaces so that the EMI emission can be removed more effectively.

Also, the driving circuit 150 is connected to the rear surface of the base chassis 140 opposite the front surface to which the gasket 130 is attached. Therefore, in order to ground the current generated by the driving circuit 150 more effectively, the gasket 130 may be located on a surface corresponding to the driving circuit 150 with reference to the base chassis 140. That is, if the driving circuit 150 is connected to a certain portion of the base chassis 140, the gasket 130 may be attached to a portion of the base chassis 140 opposite the certain portion of the base chassis 140 to which the driving circuit 150 is connected. Subsequently, the current generated by the driving circuit 150 can be transmitted to the gasket 130 through the base chassis 140 more effectively.

Although the plasma display apparatus 100 uses the double grounds including the base chassis 140 and the TSS 120 in this exemplary embodiment, the base chassis 140 may use double grounds by itself. Hereinafter, a method for the base chassis 140 to use the double grounds by itself will be described with reference to FIGS. 10 to 13.

Figure 10:
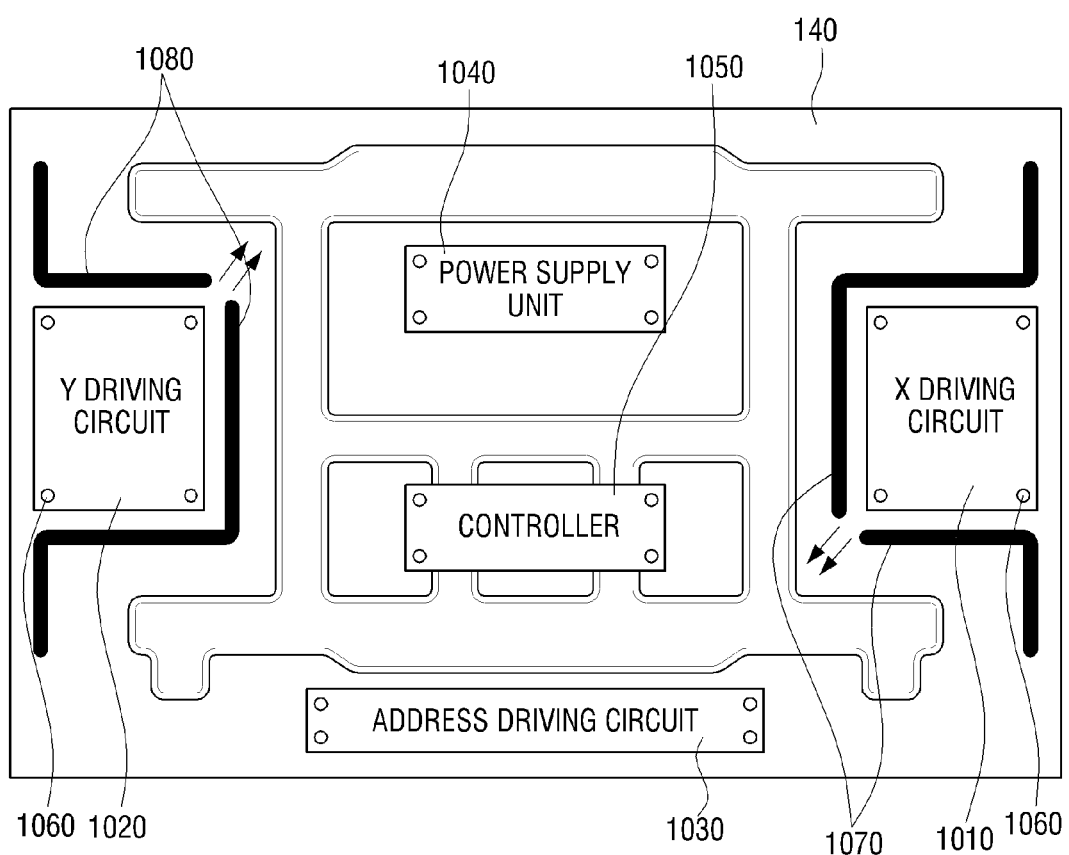
FIG. 10 is a view illustrating a base chassis according to another exemplary embodiment.

FIG. 10 is a view illustrating the base chassis 140 according to an exemplary embodiment.

As described above, the gasket 130 is attached to one side surface of the base chassis 140, whereas the driving circuit 150 is connected to the other side surface of the base chassis 140 through screws 1060 made of a conductive material.

The driving circuit 150 includes an X driving circuit 1010, a Y driving circuit 1020, an address driving circuit 1030, a power supply unit 1040, and a controller 1050.

The power supply unit 1040 supplies power to the X driving circuit 1010, the Y driving circuit 1020, the address driving circuit 1030, and the controller 1050.

The controller 1050 transmits an X electrode driving control signal, a Y electrode driving control signal and an address electrode driving control signal to the X driving circuit 1010, the Y driving circuit 1020, and the address driving circuit 1030, respectively, such that the X driving circuit 1010, the Y driving circuit 1020, and the address driving circuit 1030 operate the panel 110.

Hereinafter, the operation of the plasma display apparatus 100 by the X driving circuit 1010, the Y driving circuit 1020, and the address driving circuit 1030 will be described with reference to FIG. 11.

Figure 11:
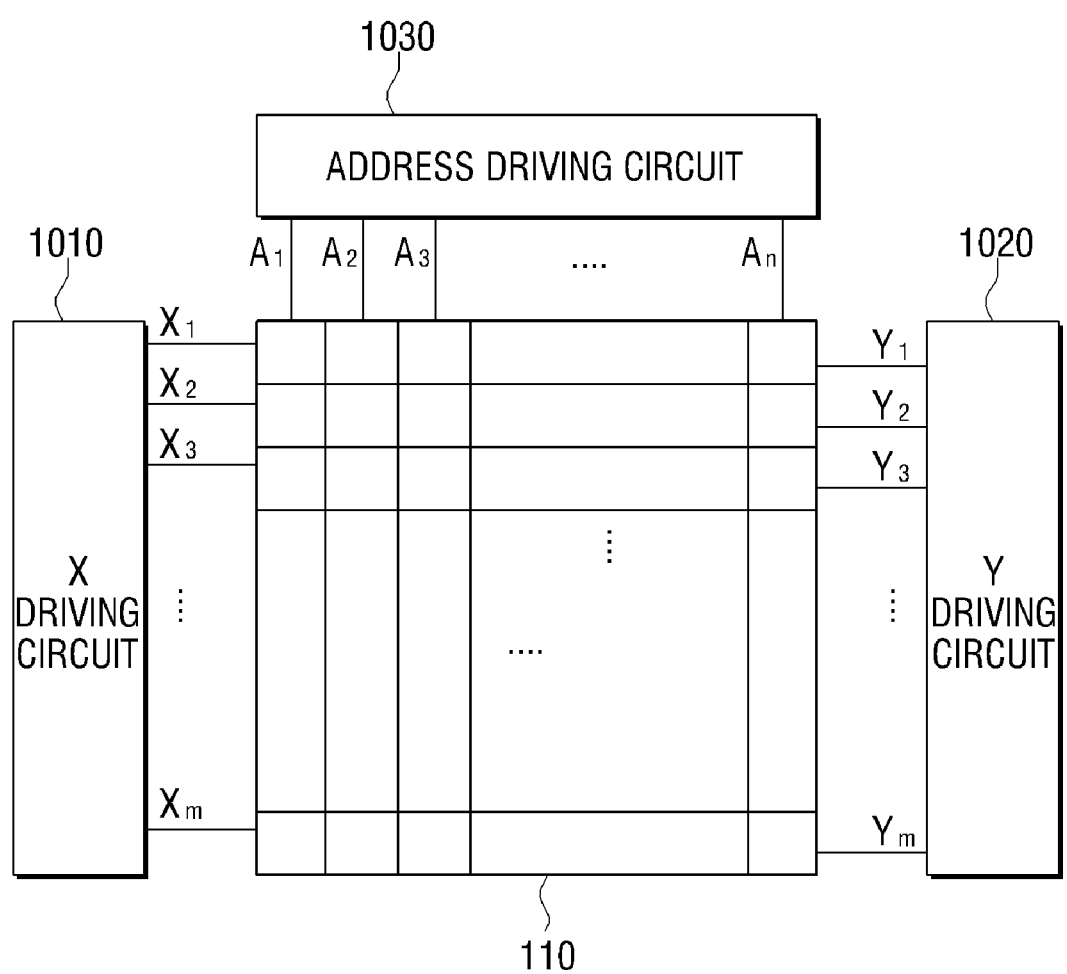
FIG. 11 is a view provided to explain a method for driving a plasma display apparatus.

FIG. 11 is a view provided to explain a method of operating the plasma display apparatus 100.

The X driving circuit 1010 is connected to the X electrode of the above-described bus electrodes 420 to operate the panel 110 based on the X electrode driving control signal received from the controller 1050, and the Y driving circuit 1020 is connected to the Y electrode of the bus electrodes 420 to operate the panel 110 based on the Y electrode driving control signal received from the controller 1050.

The X driving circuit 1010 receives the X electrode driving control signal from the controller 1050 and applies a driving voltage to the X electrode, and the Y driving circuit 1020 receives the Y electrode driving control signal from the controller 1050 and applies a driving voltage to the Y electrode. In particular, the X driving circuit 1010 and the Y driving circuit 1020 input a sustain voltage to the X electrode and the Y electrode alternately to perform sustain discharging with respect to a selected pixel.

The address driving circuit 1030 applies a data signal to select a pixel to be displayed to the address electrode 510. The bus electrodes (X electrode and Y electrode) 420 and the address electrode 510 are arranged in a crisscross pattern, and the X electrode and the Y electrode face each other with a discharge space therebetween. The discharge space formed in the crisscross section among the address electrode 420, the X electrode and the Y electrode forms a discharge cell.

The panel 110 includes a plurality of pixels which are arranged in a matrix pattern. The X electrode, the Y electrode, and the address electrode 420 are arranged on each pixel. Accordingly, the panel 110 is operated in an address display separate (ADS) driving method in which a voltage is applied to each electrode so the pixel emits light. The ADS driving method refers to a method in which each sub-field of the panel 110 is driven with separate reset section, address section, and sustain discharge section.

The reset section serves to remove a previous condition of wall charge and set up wall charge to stably perform next address discharging. The address section selects a cell which lights in the panel and a cell which does not light, and performs piling wall charge on the lighting cell (addressed cell). The sustain discharge section applies a sustain voltage to the X electrode and the Y electrode alternately and performs discharging to display an actual image on the addressed cell.

As described above, the panel 110 causes discharge using a difference between the voltage applied to the X electrode and the voltage applied to the Y electrode, and emits light using plasma obtained by discharging.

Referring back to FIG. 10, the base chassis 140 grounds the currents generated by the X driving circuit 1010, the Y driving circuit 1020, the address driving circuit 1030, the power supply unit 1040, and the controller 1050 which are mounted thereon.

To accomplish this, the base chassis 140 is connected to the X driving circuit 1010, the Y driving circuit 1020, the address driving circuit 1030, the power supply unit 1040, and the controller 1050 through the screws 1060 made of the conductive material, and the base chassis 140 is also made of a conductive material.

The base chassis 140 has a first slit 1070 and a second slit 1080 to be used as double grounds by itself.

The first slit 1070 is formed by cutting around the portion of the base chassis 140 to which the X driving circuit 1010 is connected, in the form of long recess. In particular, the first slit 1070 may be divided into two separate slits rather than one continuous slit and is formed to provide an electric passage to allow current to flow between the two slits.

Accordingly, the current generated by the X driving circuit 1010 is transmitted to the base chassis 140 through the screw 1060 connecting the X driving circuit 1010 and the base chassis 140, and is firstly grounded. In particular, the current is transmitted to an area of the base chassis 140 that is located under the X driving circuit 1010, among the areas of the base chassis 140 which are divided by the first slit 1070, through the screw 1060, and is grounded.

The current which has been transmitted to and grounded at the area of the base chassis 140 located under the X driving circuit 1010, is transmitted to the other area of the base chassis 140 where the Y driving circuit 1020, the address driving circuit 1030, the power supply unit 1040, and the controller 1050 are located, through the passage formed between the two separate slits of the first slit 1070, and is secondly grounded.

The current generated by the X driving circuit 1010 is firstly grounded at the area of the base chassis 140 located under the X driving circuit 1010, and secondly grounded at the other area of the base chassis 140, so that the EMI emission noise can be removed. Also, by partially connecting the double grounds through the first slit 1070, the EMI emission noise can be removed more effectively.

The function of the second slit 1080 is the same as that of the first slit 1070. That is, the second slit 1080 is formed by cutting around the portion of the base chassis 140 to which the Y driving circuit 1020 is connected, in the form of long recess, and may be divided into two separate slits to provide a passage to allow current to flow between the two slits.

Accordingly, the current generated by the Y driving circuit 1020 is transmitted to the base chassis 140 through the screw 1060 connecting the Y driving circuit 1020 and the base chassis 140, and is firstly grounded. In particular, the current is transmitted to an area of the base chassis 140 that is located under the Y driving circuit 1020, among the areas of the base chassis 140 divided by the second slit 180, through the screw 1060, and is grounded.

Also, the current transmitted to and grounded at the area of the base chassis 140 located under the Y driving circuit 1020 is transmitted to the other area of the base chassis 140 where the X driving circuit 1010, the address driving circuit 1030, the power supply unit 1040, and the controller 1050 are located, through the passage formed between the two separate slits of the second slit 1080, and is secondly grounded.

As described above, the current generated by the Y driving circuit 1020 is firstly grounded at the area of the base chassis 140 located under the Y driving circuit 1020 and is secondly grounded at the other area of the base chassis 140, so that the EMI emission noise can be removed. Also, by partially connecting the double grounds through the second slit 1080, the EMI emission noise can be removed more effectively.

In the above explanation, the slits are formed by cutting around the portions of the base chassis 140 to which the X driving circuit 1010 and the Y driving circuit 1020 are connected, in the form of long recess. However, this is merely an example for the convenience of explanation and a slit may be formed around one of the X driving circuit 1010 and the Y driving circuit 1020 or may be formed around the other circuits, that is, the address driving circuit 1030, the power supply unit 1040, and the controller 1050.

Also, in the above explanation, each of the first slit 1070 and the second slit 1080 has two slits such that one electric passage is formed by the two slits. The method in which current is grounded through a single electric passage is referred to as a single-point ground method. However, forming one electric passage is merely an example for the convenience of explanation.

Therefore, the first slit 1070 or the second slit 1080 may have two or more slits. For example, if the first slit 1070 is constituted by three slits, two passages for transmitting current are formed between the first ground and the secondary ground.

In this case where the two electric passages are formed, it is proper to understand that the single-point ground method is used at two spots, rather than understanding that the single-point ground method is not used.

Figure 12:
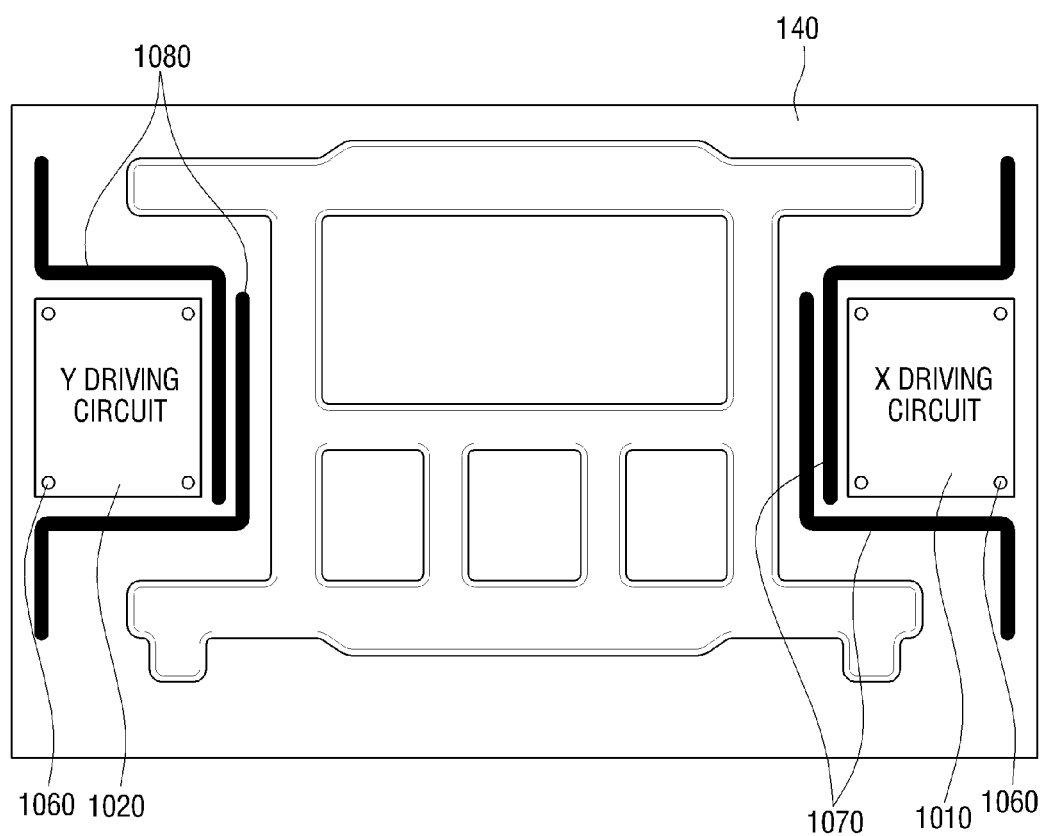
FIG. 12 is a view illustrating a base chassis according to another exemplary embodiment.

Also, the shape of each of the first slit 1070 and the second slit 1080 shown in FIG. 10 is merely an example and the first slit 1070 and the second slit 1080 may be formed to have other shape different from that of the slit of FIG. 10, as shown in FIG. 12.

FIG. 12 is a view illustrating a base chassis 140 according to another exemplary embodiment. From FIG. 12, the address driving circuit 130, the power supply unit 1040, and the controller 1050 are omitted for the convenience of explanation.

If two first slits 1070 and two second slits 1080 form passages as shown in FIG. 12, current can be transmitted through the passages between first ground and secondary ground so that the EMI can be removed more effectively.

In the above explanation, although the slits are provided on the base chassis 140 and the current is grounded at the base chassis 40 in the single-point ground method in which the current is transmitted through one passage formed between the two slits, exemplary embodiments can be applied to a situation in which the current is grounded at the base chassis 140 in the single-point ground method without using a slit. This will be explained with reference to FIG. 13.

Figure 13:
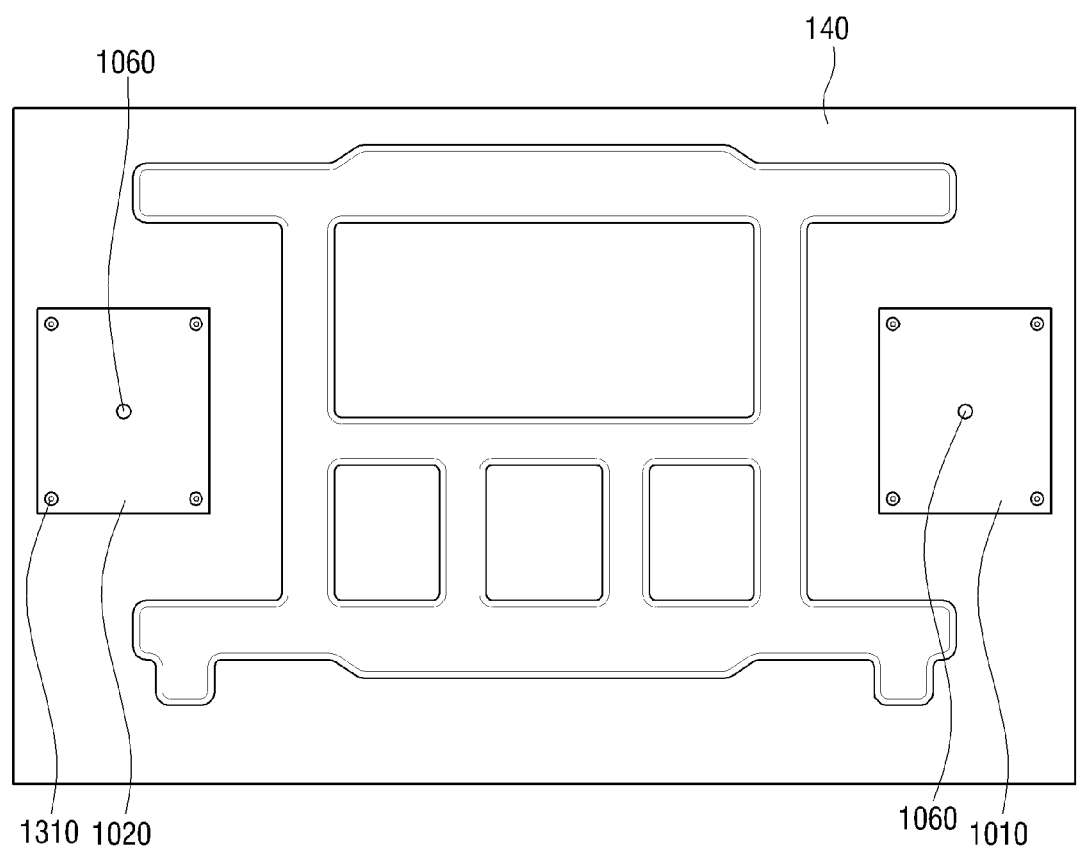
FIG. 13 is a view illustrating a base chassis according to still another exemplary embodiment.

FIG. 13 is a view illustrating a base chassis 140 according to still another exemplary embodiment. As shown in FIG. 13, the X driving circuit 1010 is connected to the base chassis 140 through a single screw 1060 rather than a plurality of screws and is also connected to the base chassis 140 through four non-conductive connecting elements 1310. Also, the Y driving circuit 1020 is connected to the base chassis 140 through a single screw 1060 rather than a plurality of screws and is also connected to the base chassis 140 through four non-conductive connecting elements 1310.

In FIG. 13, the portion marked by '○' indicates where the screw 1060 for connecting the X driving circuit 1010 or the Y driving circuit 1020 and the base chassis 140 is located, and the portion marked by ◎ indicates where the non-conductive connecting elements 1310 for connecting the X driving circuit 1010 or the Y driving circuit 1020 and the base chassis 140 are located.

Herein, the non-conductive connecting elements 1310 are not provided for transmitting the current generated by the X driving circuit 1010 or the Y driving circuit 1020 to the base chassis 140, but instead are simply used to overcome a weak connection between the X driving circuit 1010 or the Y driving circuit 1020 and the base chassis 140 when they are connected to each other through the screws 1060 only. Therefore, the X driving circuit 1010 and the Y driving circuit 1020 each are connected to the base chassis 140 through the screw 1060, which is a single conductive medium.

Since the X driving circuit 1010 and the Y driving circuit 1020 are grounded to the base chassis 140 in the single-point ground method as described above, the current generated by the X driving circuit 1010 or the Y driving circuit 1020 is transmitted to and grounded at the base chassis 140 only at one point. Accordingly, part of current generated by each of the X driving circuit 1010 and the Y driving circuit 1020 is transmitted to the base chassis 140 and the remaining current is circled in the X driving circuit 1010 and the Y driving circuit 1020 and offsets the EMI.

Of course, use of the four non-conductive connecting elements 1310 is merely an example for the convenience of explanation and five or more or three or less non-conductive connecting elements may be used. Also, if there is no problem in connecting the X driving circuit 1010 or the Y driving circuit 1020 and the base chassis 140 through the screw 1060 only, none of the non-conductive connecting elements 1310 may be used.

Although the one screw 1060 for each of the X driving circuit 1010 and the Y driving circuit 1020 is used as a conductive connecting element in the above embodiment, two or more screws 1060 may be used if necessary. However, as the number of screws 1060 increases, the effect of reducing the EMI may decrease.

In FIG. 13, the X driving circuit 1010 and the Y driving circuit 1020 are grounded to the base chassis 140 in single-point ground. In FIG. 13, single-point ground is used but double ground is not used. However, exemplary embodiments can be applied situations in which both the single-point ground and the double ground are used. Hereinafter, a method in which single-point ground is made in double ground method will be explained with reference to FIGS. 14 to 16.

Figure 14:
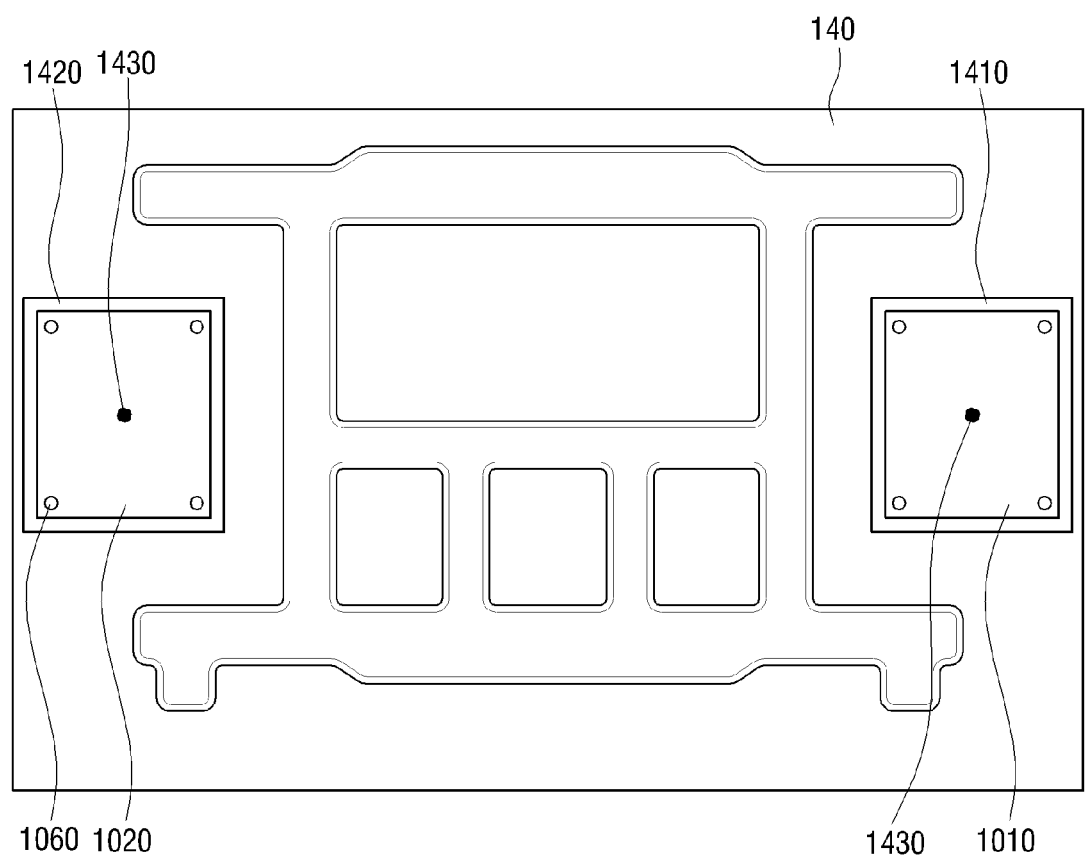
FIG. 14 is a view illustrating a base chassis according to still another exemplary embodiment.
Figure 15:
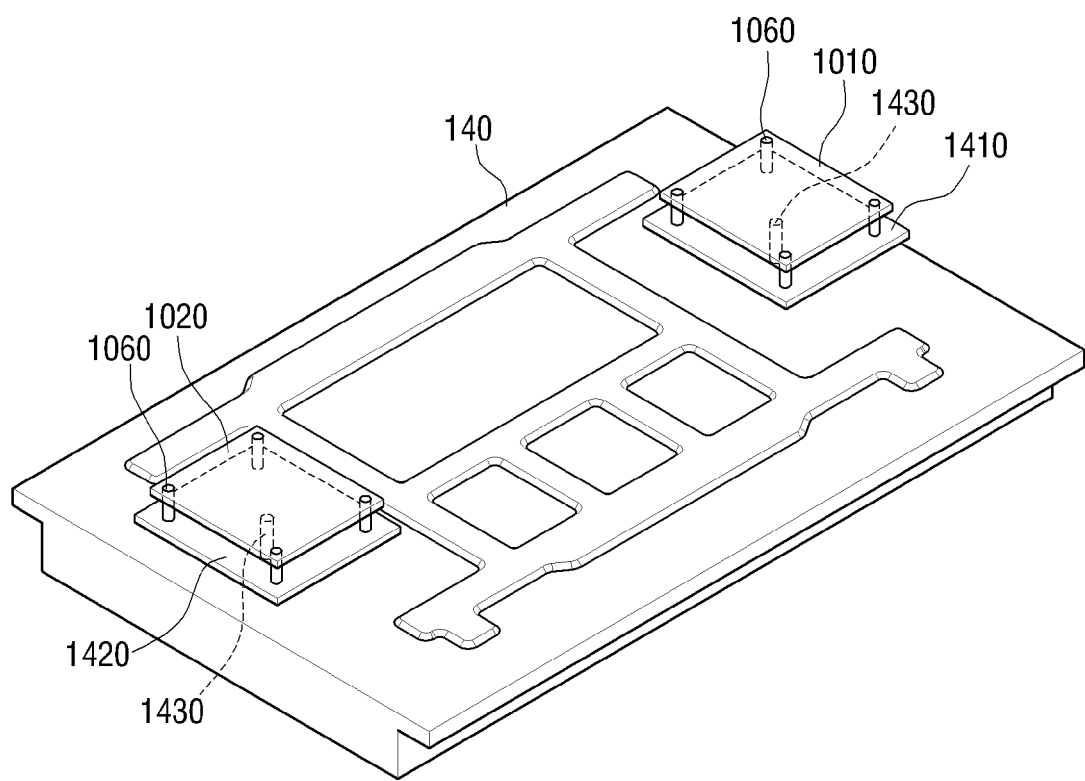
FIG. 15 is a perspective view of the base chassis of FIG. 14.
Figure 16:
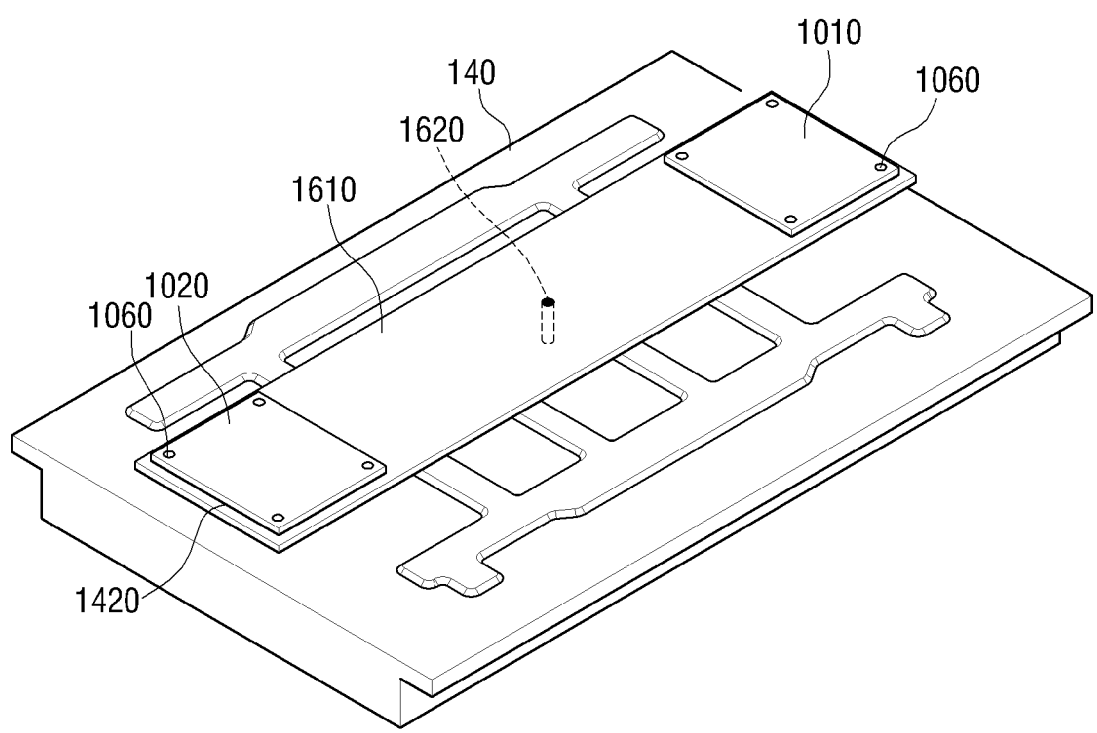
FIG. 16 is a view illustrating a base chassis according to still another exemplary embodiment.

In the embodiment of FIGS. 14 to 16, a requisite number of non-conductive connecting elements 1310 may be used. However, for the convenience of simplicity, illustration and description of the non-conductive connecting elements 1310 are omitted.

FIG. 14 is a view illustrating a base chassis 140 according to still another exemplary embodiment. As shown in FIG. 14, the X driving circuit 1010 is connected to a conductive plate 1410 through a plurality of screws 1060, and the conductive plate 1410 is connected to the base chassis 140 through a single screw 1430. Also, the Y driving circuit 1020 is connected to a conductive plate 1420 through a plurality of screws 1060 and the conductive plate 1420 is connected to the base chassis 140 through a single screw 1430.

In FIG. 14, the portion marked by '○' indicates where the screws 1060 for connecting the X driving circuit 1010 or the Y driving circuit 1020 and the conductive plate 1410, 1420 are located, and the portion marked by '●' indicates where the screw 1430 for connecting the conductive plate 1410, 1420 and the bas chassis 140 is located.

FIG. 15 is a perspective view illustrating the base chassis 140 of FIG. 14 to explain how the screws 1060, 1430 are positioned. As shown in FIG. 15, since the X driving circuit 1010 is connected to the conductive plate 1410 through the plurality of screws 1060, the current generated by the X driving circuit 1010 is transmitted to the conductive plate 1410 through the plurality of screws 1060 and is firstly grounded at the conductive plate 1410. Also, since the conductive plate 1410 is connected to the base chassis 140 through the single screw 1430, the current generated at the conductive plate 1410 is transmitted to the base chassis 140 through the single screw 1430 and is secondly grounded at the base chassis 140.

Likewise, since the Y driving circuit 1020 is connected to the conductive plate 1420 through the plurality of screws 1060, the current generated be the Y driving circuit 1020 is transmitted to the conductive plate 1420 through the plurality of screws 1060 and is firstly grounded at the conductive plate 1420. Also, since the conductive plate 1420 is connected to the base chassis 140 through the single screw 1430, the current generated at the conductive plate 1420 is transmitted to the base chassis 140 through the single screw 1430 and is secondly grounded at the base chassis 140.

Since the X driving circuit 1010 and the Y driving circuit 1020 are grounded to the base chassis 140 in the single-point ground method, the current generated by each of the X driving circuit 1010 and the Y driving circuit 1020 is transmitted to the base chassis 140 at one point and is finally grounded at the base chassis 140, and accordingly, the current firstly transmitted to the conductive plate 1410, 1420 is circled in the conductive plate 1410, 1420 so that the EMI is offset.

Although the conductive plate 1410 connected to the X driving circuit 1010 and the conductive plate 1420 connected to the Y driving circuit 1020 are separately provided in the above embodiment, this is merely an example. Exemplary embodiments can be applied to a situation in which a single conductive plate 16010 is provided as shown in FIG. 16.

FIG. 16 is a view illustrating a base chassis 140 according to still another exemplary embodiment. As shown in FIG. 16, the X driving circuit 1010 and the Y driving circuit 1020 are connected to a single conductive plate 1610 through a plurality of screws 1060. That is, the X driving circuit 1010 and the Y driving circuit 1020 are arranged on the single conductive plate 1610.

The conductive plate 1610 is connected to the base chassis 140 through a single screw 1620.

Accordingly, the currents generated by the X driving circuit and the Y driving circuit 1020 are transmitted to the single conductive plate 1610 and the current transmitted to the conductive plate 1610 is grounded at the base chassis 140 in the single-point ground method. Accordingly, the currents generated by the X driving circuit 1010 and the Y driving circuit 1020 are transmitted to the base chassis 140 at one point and finally grounded at the base chassis 140, and accordingly, the current firstly transmitted to the conductive plate 1610 is circled in the conductive plate 1610 so that the EMI is offset.

Of course, the number of screws 1060, 1620 may change if necessary.

In the structure of the base chassis 140 according to the embodiments of FIGS. 10, 12, 14, and 15, since the X driving circuit 1010 and the Y driving circuit 1020 are grounded to the base chassis 140 at different single points, there may be a difference between a ground potential level of the X driving circuit 1010 and a ground potential level of the Y driving circuit 1020.

If there is a difference between the ground potential levels, the plasma display apparatus 100 may malfunction due to the controller 1050 which transmits a control signal without considering the different ground potential levels.

Figure 17:
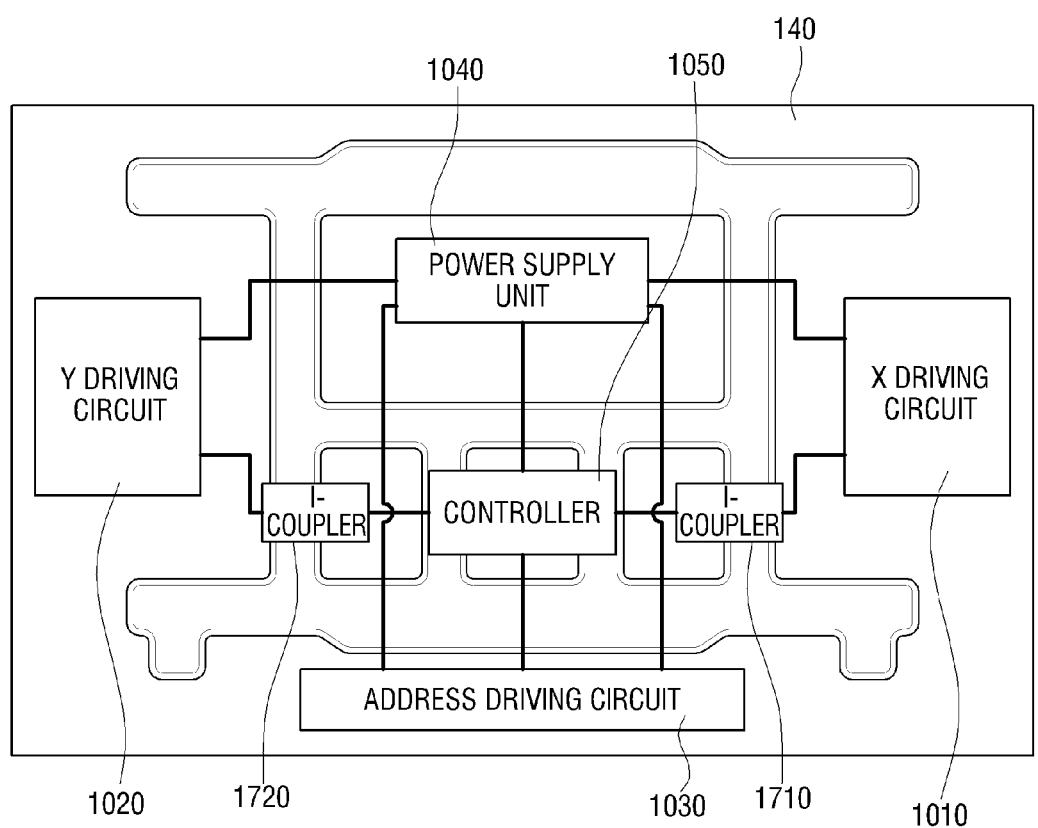
FIG. 17 is a view illustrating the base chassis to which an isolation IC is added.

FIG. 17 is a view illustrating the base chassis 140 to which an isolation IC is additionally provided in order to solve the above problem. In FIG. 17, I-couplers 1710 and 1720 are used as an example of the isolation IC.

The I-couplers 1710 and 1720 are digital insulation elements and perform DC-DC converting.

Accordingly, the I-coupler 1710 is connected between the X driving circuit 1010 and the controller 1050, and the I-coupler 1720 is connected between the Y driving circuit 1020 and the controller 1050, so the plasma display apparatus can be operated without malfunction even if there is a difference between the ground potential of the X driving circuit 1010 and the ground potential of the Y driving circuit 1020.

That is, the I-couplers 1710 and 1720 convert a control signal generated by the controller 1050 into a control signal based on the ground potential of the X driving circuit 1010, and convert a control signal generated by the controller 1050 into a control signal based on the ground potential of the Y driving circuit 1020, such that the X driving circuit 1010 and the Y driving circuit 1020 are controlled by the control signals according to the ground potential level of the X driving circuit 1010 and the ground potential level of the Y driving circuit 1020.

In the above, although the method of correcting the difference between the ground potential levels using the I-couplers 1710 and 1720 is described, this is merely an example. Exemplary embodiments can be applied to a situation in which the ground potential level is corrected using an element other than the I-couplers 1710 and 1720 or by changing the shape of the base chassis 140 without using an extra element.

The examples of this situation are as follows.

In the case of the base chassis 140 on which a slit is formed as shown in FIGS. 10 and 12, the ground potential level is corrected by adjusting the thickness of the slit or the gap between the slits. For example, by enlarging the gap between the slits shown in FIG. 10, the passage allowing the current to flow from the area of the base chassis 140 where the X driving circuit 1010 or the Y driving circuit 1020 is located to the other area is enlarged.

Accordingly, the current generated by the X driving circuit 1010 or the Y driving circuit 1020 can flow into the other area of the base chassis 140, where the X driving circuit 1010 or the Y driving circuit 1020 are not located, more smoothly, and thus the difference in the ground levels between the area of the base chassis 140 where the X driving circuit 1010 or the Y driving circuit 1020 is located and the other area of the base chassis 140 is reduced.

Next, in the case of the base chassis 140 in which single-point ground using a single screw is performed as shown in FIGS. 14 and 15, the ground potential level is corrected by adjusting the number of screws. For example, if the number of screws ('●') connecting the conductive plate 1410, 1420 and the base chassis 140 increases, the number of passages allowing current to flow from the conductive plates 1410 and 1420 to the base chassis 140 increases.

Accordingly, the current generated by the X driving circuit 1010 or the Y driving circuit 1020 flows into the base chassis 140 through the conductive plates 1410 and 1420 more smoothly, so that the difference in the potential level between the conductive plate 1410 where the X driving circuit 1010 is located and the conductive plate 1420 where the Y driving circuit 1020 is located can be reduced.

As described above, the ground potential level can be corrected by changing the shape of the base chassis 140.

In the above explanation, the EMI emitted from the front surface of the plasma display apparatus 100 can be reduced by coupling the TSS 120 and the base chassis 140 using the gasket 130, forming the slit on the base chassis 140 or changing the connection condition between the base chassis 140 and the driving circuit 150.

Also, in order to reduce the EMI emitted from the front surface of the plasma display apparatus 100, only the first material to prevent surface reflection, the second material to correct color and improve color purity, and the third material to absorb near infrared rays are coated, without providing an extra configuration or material to shield the EMI on the upper portion of the upper panel 111.

Referring back to FIG. 1, the back cover 160 to reduce the EMI emitted from the rear surface of the plasma display apparatus 100 will be described.

As described above, the EMI emitted from the front surface of the plasma display apparatus 100 is reduced by coupling the TSS 120 and the base chassis 140 using the gasket 130, forming the slit on the base chassis 140 or changing the connecting condition between the base chassis 140 and the driving circuit 150.

The back cover 160 does not cover the front surface of the panel 110, the rear surface of the panel 110 and the front surface of the base chassis 140. Instead, the back cover 160 is directly connected to the rear surface of the base chassis 140 to cover the rear surface of the plasma display apparatus 100, and shields the EMI and prevents damage to the driving circuit 150 by being connected to the base chassis 140. To accomplish this, the back cover 160 is made of a conductive material.

As described above, according to various exemplary embodiments, the emission of the EMI generated when the PDP is driven can be reduced effectively using only the structure of the base chassis 140, without providing an extra filter on the front surface of the plasma display apparatus 100.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A plasma display apparatus comprising:
   a panel;
   a driving circuit which drives the panel; and
   a base chassis comprising a first area to which the driving circuit is connected, and at least one slit formed around the first area,
   wherein the at least one slit comprises two or more slits, and the base chassis further comprises a second area which is different from the first area, and the two or more slits divide the base chassis into the first area and the second area,
   wherein part of the current transmitted to the first area is transmitted from the first area to the second area through a passage formed between the two or more slits, and remaining current transmitted to the first area offsets electromagnetic interference (EMI) generated by the panel.

2. The plasma display apparatus as claimed in claim 1, wherein an electric passage is formed in the base chassis between the two or more slits between the first area and the second area.

3. The plasma display apparatus as claimed in claim 1, wherein the first area and the driving circuit are electrically connected so that current generated by the driving circuit is transmitted to the first area.

4. The plasma display apparatus as claimed in claim 1, wherein a degree of the offset EMI is based on a width of each of the two or more slits and a gap between the two or more slits.

5. The plasma display apparatus as claimed in claim 1, wherein the driving circuit comprises an X electrode driving circuit and a Y electrode driving circuit, and the two or more slits comprise at least a first slit which is formed around the first area to which the X electrode driving circuit is connected, and a second slit which is formed around the second area to which the Y electrode driving circuit is connected.

6. The plasma display apparatus as claimed in claim 5, wherein:
   the first slit comprises two or more first slits or the second slit comprises two or more second slits, and
   an electric passage is formed in the base chassis between the two first slits or between the two second slits.

7. The plasma display apparatus as claimed in claim 1, further comprising:
   a controller which controls the driving circuit; and
   an isolation integrated circuit which electrically isolates ground levels between the controller and the driving circuit.

8. The plasma display apparatus as claimed in claim 1, wherein the driving circuit and the base chassis are connected through a conductive material.

9. A plasma display apparatus comprising:
a panel;
a driving circuit which drives the panel;
a single conductive medium; and
a base chassis comprising:
a first area to which the driving circuit is connected; and
a second area which is different from the first area,
wherein the single conductive medium electrically connects the driving circuit and the first area and forms a single-point ground, and
wherein part of current generated by the driving circuit is transmitted to the base chassis through the single conductive medium.

10. The plasma display apparatus as claimed in claim 9, wherein the remaining current of the current generated by the driving circuit offsets electromagnetic interference (EMI) generated by the panel.

11. A plasma display apparatus comprising:
a panel;
a first driving circuit and a second driving circuit which drive the panel; and
a base chassis comprising a first area, a second area, and a third area between the first area and the second area;
wherein the first driving circuit is connected to the first area and the second driving circuit is connected to the second area;
wherein the base chassis further comprises two first slits substantially separating the first area from the third area and an electrical passage between the two first slits forming a single-point ground between the first area and the third area and part of current generated by the first driving circuit is transmitted to the third area through the electrical passage between the two first slits; and
wherein the base chassis further comprises two second slits substantially separating the second area from the third area and an electrical passage between the two second slits forming a single-point ground between the second area and the third area and part of current generated by the second driving circuit is transmitted to the third area through the electrical passage between the two second slits.

12. The plasma display apparatus as claimed in claim 11, wherein the remaining current of the current generated by the first driving circuit and the remaining current of the current generated by the second driving circuit offset electromagnetic interference (EMI) generated by the panel.

* * * * *